(12) United States Patent
Chan et al.

(10) Patent No.: US 10,177,163 B1
(45) Date of Patent: Jan. 8, 2019

(54) SOI-BASED FLOATING GATE MEMORY CELL

(71) Applicant: GLOBALFOUNDRIES Inc., Grand Cayman (KY)

(72) Inventors: Nigel Chan, Dresden (DE); Elliot John Smith, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/895,053

(22) Filed: Feb. 13, 2018

(51) Int. Cl.
| | | |
|---|---|---|
| H01L 23/02 | (2006.01) |
| H01L 27/11521 | (2017.01) |
| H01L 29/06 | (2006.01) |
| H01L 29/10 | (2006.01) |
| H01L 27/11558 | (2017.01) |
| H01L 21/762 | (2006.01) |
| H01L 29/66 | (2006.01) |
| H01L 29/788 | (2006.01) |
| H01L 27/12 | (2006.01) |
| H01L 21/28 | (2006.01) |
| H01L 21/306 | (2006.01) |
| H01L 21/308 | (2006.01) |
| H01L 21/02 | (2006.01) |
| H01L 21/3105 | (2006.01) |

(Continued)

(52) U.S. Cl.
CPC .. H01L 27/11521 (2013.01); H01L 21/76283 (2013.01); H01L 27/11558 (2013.01); H01L 27/1203 (2013.01); H01L 29/0649 (2013.01); H01L 29/1087 (2013.01); H01L 29/66825 (2013.01); H01L 29/7881 (2013.01); *H01L 21/0257* (2013.01); *H01L 21/02164* (2013.01); *H01L 21/266* (2013.01); *H01L 21/26513* (2013.01); *H01L 21/28273* (2013.01); *H01L 21/308* (2013.01); *H01L 21/30604* (2013.01); *H01L 21/31053* (2013.01)

(58) Field of Classification Search
CPC .......... H01L 29/1087; H01L 29/66825; H01L 29/7881; H01L 21/02164; H01L 21/0257; H01L 21/26513; H01L 21/266; H01L 21/28273; H01L 21/308; H01L 21/31053
See application file for complete search history.

(56) References Cited

U.S. PATENT DOCUMENTS

| 7,115,949 B2 | 10/2006 | Hoefler et al. |
| 8,008,713 B2 | 8/2011 | Dobuzinsky et al. |

(Continued)

*Primary Examiner* — Elias M Ullah
(74) *Attorney, Agent, or Firm* — Amerson Law Firm, PLLC

(57) ABSTRACT

One illustrative device disclosed a floating gate capacitor located in and above a first region of an SOI substrate located on a first side of an isolation trench and a transistor device located in and above a second region of the SOI substrate that is on the opposite side of the isolation trench. The device also includes a control gate formed in the bulk semiconductor layer in the first region and a gate structure that extends across the isolation trench and above the first and second regions. A first portion of the gate structure is positioned above the first region and the control gate and a second portion of the gate structure is positioned above the second region, wherein the first portion of the gate structure constitutes a floating gate for the floating gate capacitor and the second portion of the gate structure constitutes a transistor gate structure for the transistor device.

19 Claims, 21 Drawing Sheets

(51) Int. Cl.
*H01L 21/265* (2006.01)
*H01L 21/266* (2006.01)

(56) References Cited

U.S. PATENT DOCUMENTS 8,344,443 B2 1/2013 Chen et al.
2006/0186456 A1 8/2006 Burnett et al.

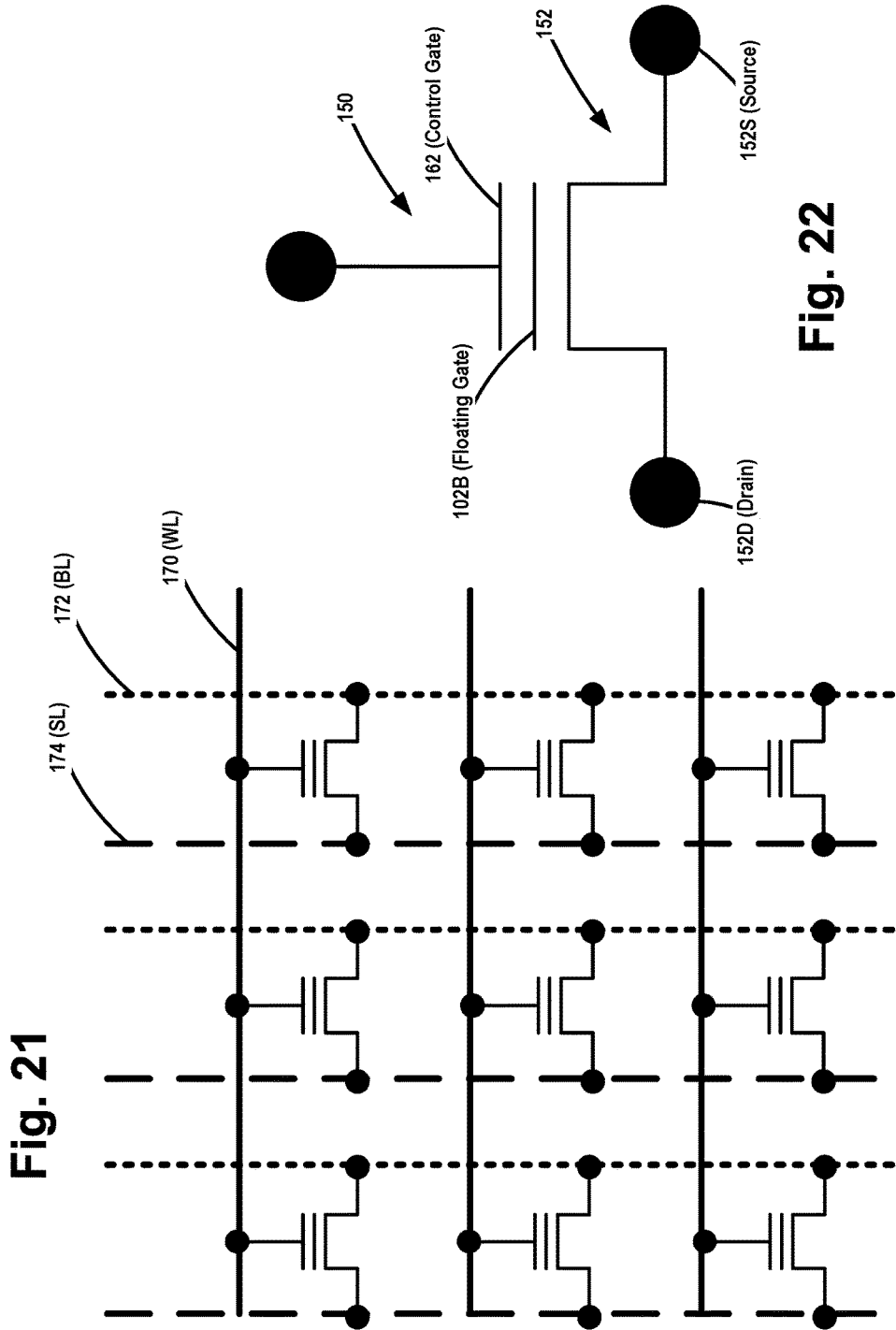

SOI-BASED FLOATING GATE MEMORY CELL

BACKGROUND OF THE DISCLOSURE

1. Field of the Disclosure

The present disclosure generally relates to the fabrication of semiconductor devices, and, more particularly, to an SOI (Semiconductor-on-Insulator) based floating gate memory cell and methods of making such memory cells.

2. Description of the Related Art

In general, memory devices are the means by which electronic information is stored. There are many types of memory devices, SRAMs (Static Random Access Memory), DRAMs (Dynamic Random Access Memory), ROMs (Read Only Memory), etc., each of which has its own advantages and disadvantages relative to other types of memory devices. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

Memory devices can be split into two main categories: volatile and nonvolatile. Volatile memory devices lose any data as soon as the memory system is turned off and, accordingly, such devices require constant power to remain viable. Most types of random access memory (RAM) fall into this category. Nonvolatile memory devices do not lose data when the memory system is turned off. One type of nonvolatile memory (NVM) device is known as a floating gate memory device. A floating gate memory device includes a field effect transistor that has a source, a drain, an access or a control gate, and a floating gate. In general, such a floating gate memory device has a similar structure to a traditional MOS transistor except there are two gates—the floating gate and the control gate—positioned above the substrate. The floating gate is positioned vertically below the control gate and above the surface of the substrate. The floating gate is isolated from the substrate by a gate insulation layer. The floating gate is isolated from the control gate by an inter-polysilicon dielectric (IPD) positioned between the two gates. One form of IPD comprises alternating layers of silicon dioxide, silicon nitride and silicon dioxide (ONO). In floating gate memory devices, charge or data is stored in the floating gate and is retained when the power is removed. The charge or data is stored in the floating gate by applying a voltage to the control gate.

The present disclosure is directed to various embodiments of an SOI-based floating gate memory cell and methods of making such memory cells.

SUMMARY OF EMBODIMENTS OF THE DISCLOSURE

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of an SOI-based floating gate memory cell and methods of making such memory cells. One illustrative device disclosed herein includes an SOI substrate, an isolation trench that extends into the bulk semiconductor layer of the SOI substrate, a floating gate capacitor located in and above a first region of the substrate located on a first side of the isolation trench and a transistor device located in and above a second region of the substrate that is on the opposite side of the isolation trench. In this example, the device also includes a control gate formed in the bulk semiconductor layer in the first region and a gate structure that extends across the isolation trench and above the first and second regions. In this illustrative embodiment, a first portion of the gate structure is positioned above the first region and the control gate and a second portion of the gate structure is positioned above the second region, wherein the first portion of the gate structure constitutes a floating gate for the floating gate capacitor and the second portion of the gate structure constitutes a transistor gate structure for the transistor device.

BRIEF DESCRIPTION OF THE DRAWINGS

The disclosure may be understood by reference to the following description taken in conjunction with the accompanying drawings, in which like reference numerals identify like elements, and in which:

FIGS. 1-22 are various views that depict various embodiments of an SOI-based floating gate memory cell and methods of making such memory cells.

Figure 1:
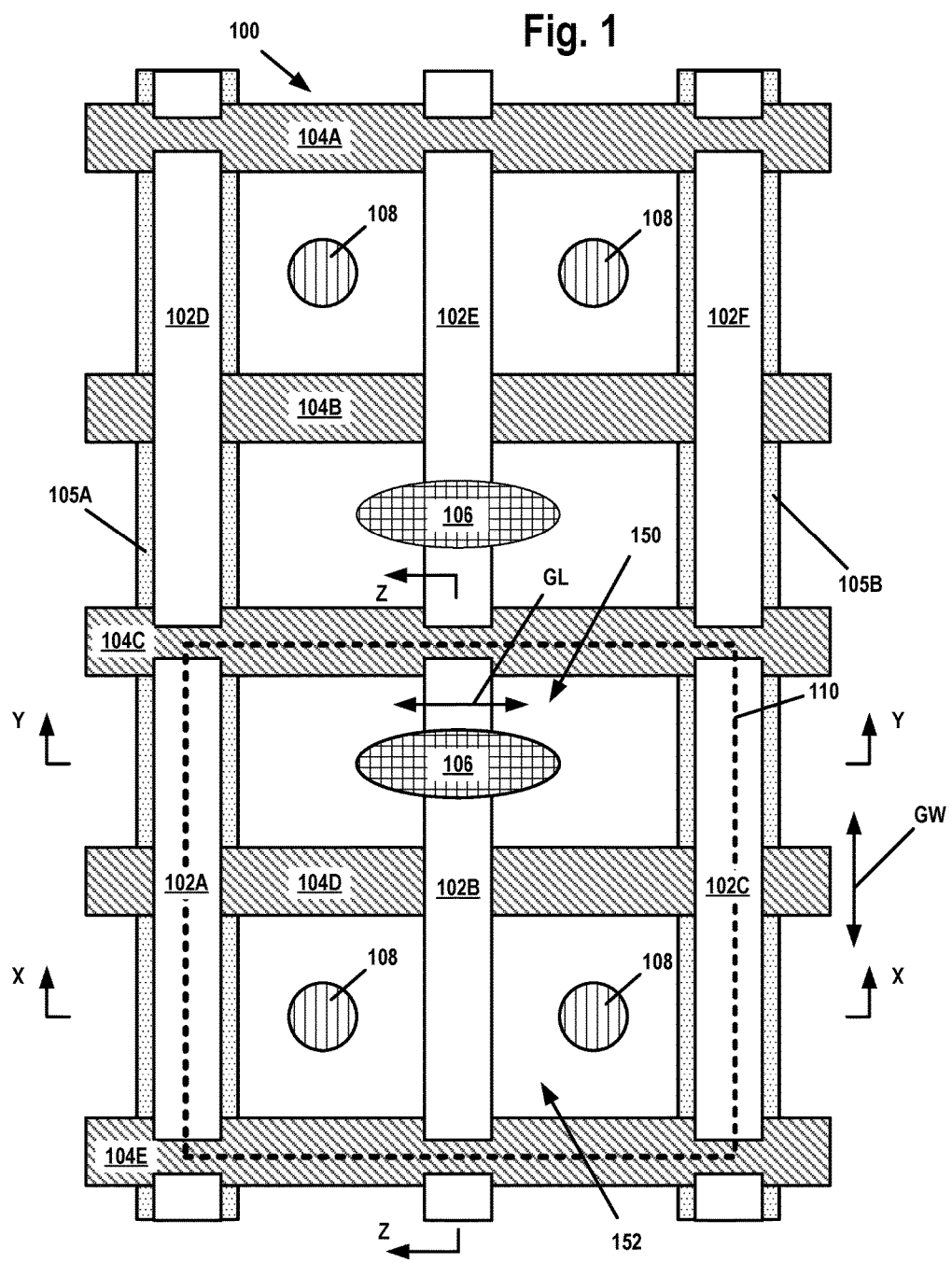
Figure 2:
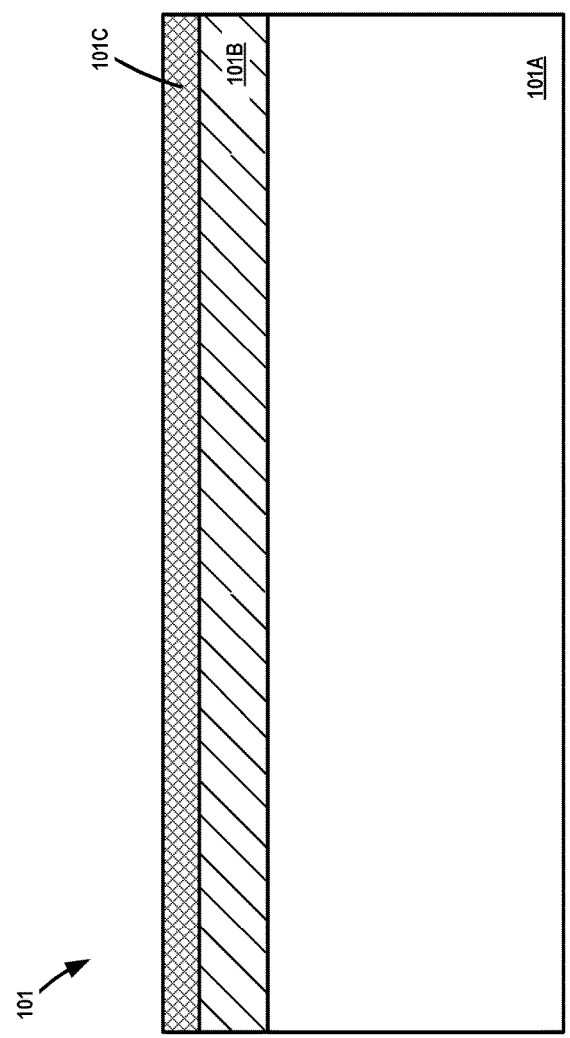

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation of the subject matter disclosed herein are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 1-22 are various views that depict various embodiments of an SOI-based floating gate memory cell and methods of making such memory cells. By way of example only, the illustrative transistors for the memory cells depicted herein are planar transistor devices. However, as will be appreciated by those skilled in the art after a complete reading of the present application, the memory cells disclosed herein may be manufactured using transistors having a different configuration, e.g., FinFET transistors, vertical transistors, etc. Thus, the various illustrative embodiments of various memory cells disclosed herein should not be considered to be limited to use with any particular form of transistor device.

FIG. 1 is a simplistic plan view of one illustrative embodiment of an SOI-based floating gate memory cell 110 disclosed herein. With reference to FIG. 1, one illustrative embodiment of an integrated circuit product 100 comprises one illustrative example of various embodiments of a memory cell 110 disclosed herein. Such memory cells 110 may be fabricated in and above an SOI (Semiconductor-on-Insulator) substrate 101 (see FIG. 2). The SOI substrate 101 includes a bulk semiconductor layer 101A, a buried insulation layer 101B and an active semiconductor layer 101C positioned on the buried insulation layer 101B. Typically, semiconductor devices are formed in and above the active layer 101C. The bulk substrate 101A and the active layer 101C may be made of a variety of different semiconductor materials, e.g., silicon, silicon germanium, etc. The bulk substrate 101A and the active layer 101C may be made of the same semiconductor material or they may be made of different semiconductor materials. The buried insulation layer 101B may be comprised of a variety of different insulating materials, e.g., silicon dioxide, silicon nitride, etc. The thickness of the buried insulation layer 101B may vary depending upon the particular application. In one illustrative embodiment, based upon current-day technology, the thickness of the buried insulation layer 101B may be about 15-30 nm. Similarly, the thickness of the active layer 101C may also vary depending upon the particular application. In one illustrative embodiment, where it is intended to form fully-depleted transistor devices on the substrate 101, the active layer 101C may have a thickness on the order of about 5-15 nm. Thus, the terms "substrate" or "semiconductor substrate" should be understood to cover all semiconducting materials and all forms of such materials. Additionally, various doped regions, e.g., threshold voltage adjust implant regions or source/drain extension implant regions and the like, are not depicted in the attached drawings.

With reference to FIG. 1, the product 100 comprises a plurality of simplistically depicted gate structures 102A-F (collectively referenced using the reference numeral 102), a plurality of relatively deep isolation trenches 104A-E (collectively referenced using the reference numeral 104), a plurality of relatively shallower isolation trenches 105A-B (collectively referenced using the reference numeral 105), a relatively enlarged gate contact structure 106 and a plurality of illustrative source/drain contact structures 108. As depicted, in this illustrative example, the gate structures 102A and 102C are "dummy" gate structures. In general, and as described more fully below, the memory cell 110 comprises a floating gate capacitor 150 (that comprises the enlarged gate contact structure 106) and a transistor 152, wherein the deep isolation trench 104D is positioned between the floating gate capacitor 150 and the transistor 152 so as to electrically isolate the floating gate capacitor 150 from the transistor 152. In this example, the gate structure 102B is shared by both of the floating gate capacitor 150 and the transistor 152. The gate structure 102B functions as a floating gate for the memory cell 110 and it also constitutes a gate structure for the transistor 152.

Also depicted in FIG. 1 are the locations where various cross-sectional views "X-X", "Y-Y" and "Z-Z" shown in subsequent drawings are taken. More specifically, the view X-X is a cross-sectional view taken through the transistor 152 in the gate length ("GL") direction of the transistor 152. The view Y-Y is a cross-sectional view taken through the floating gate capacitor 150 in the direction indicated. The view Z-Z is a cross-sectional view taken through the axial length of the gate structure 102B in a direction corresponding to the gate width direction ("GW") of the transistor 152.

Figure 3:
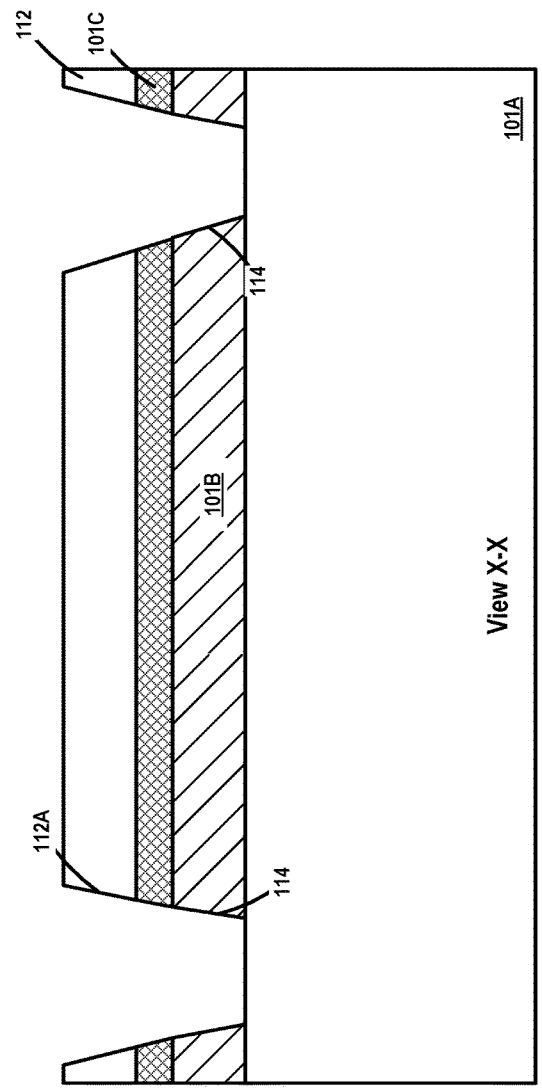
Figure 4:
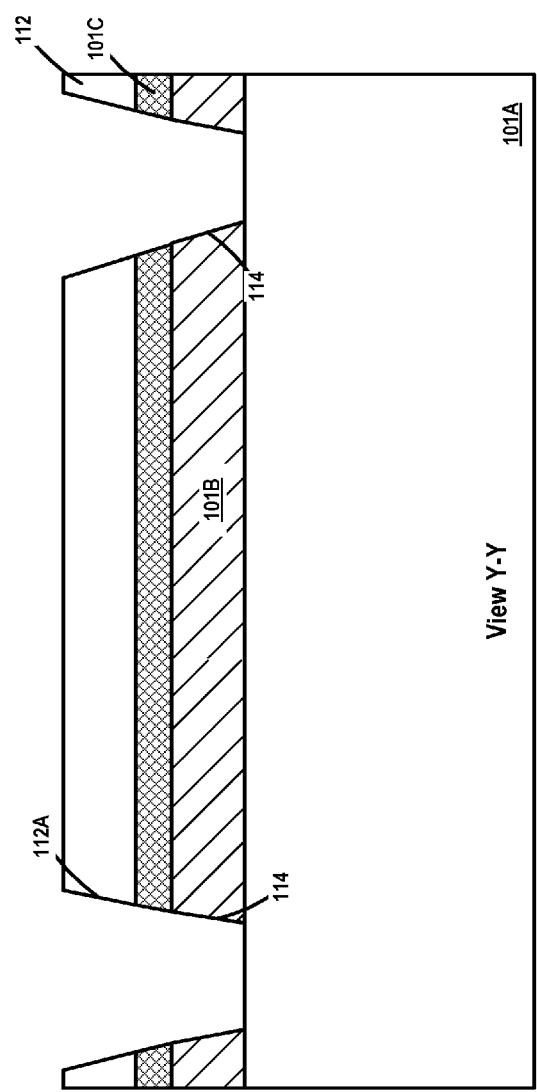
Figure 5:
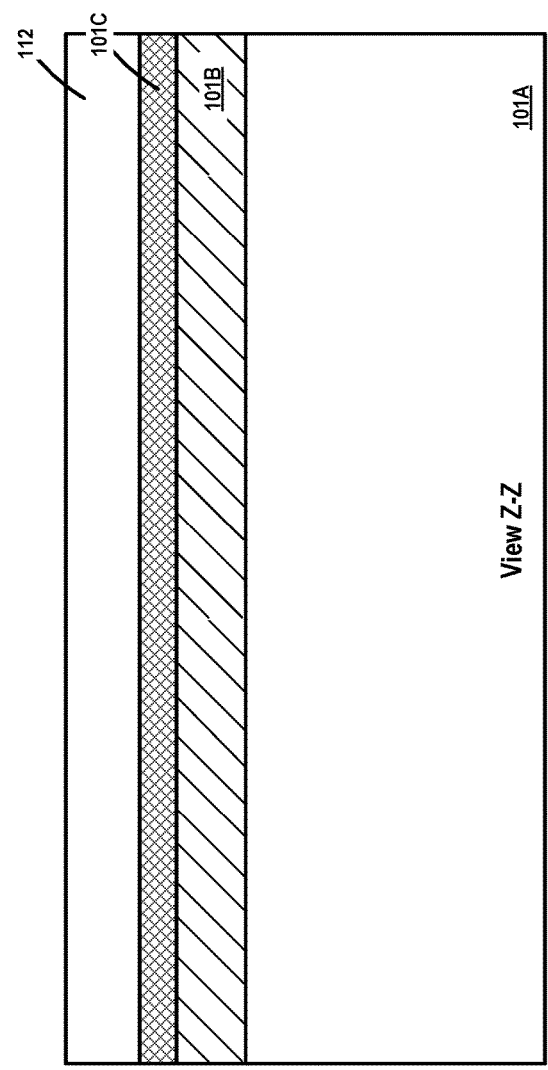

FIG. 3 (view X-X), FIG. 4 (view Y-Y) and FIG. 5 (view Z-Z) depict the IC product 100 after several process operations were performed. First, a patterned etch mask 112, e.g., a patterned layer of photoresist or a patterned hard mask, was formed above the active layer 101C. The patterned etch mask 112 comprises a plurality of openings 112A that correspond to the location where the relatively shallower isolation structures 105 will be formed. Thereafter, one or more common etching processes were performed through the patterned etch mask 112 to remove exposed portions of the active layer 101C and, thereafter, exposed portions of the buried insulation layer 101B. These process operations result in the formation of relatively shallow trenches 114 in the active layer 101C and the buried insulation layer 101B. As depicted, in one illustrative embodiment, the relatively shallower trenches 114 essentially stop on the bulk semiconductor layer 101A.

Figure 6:
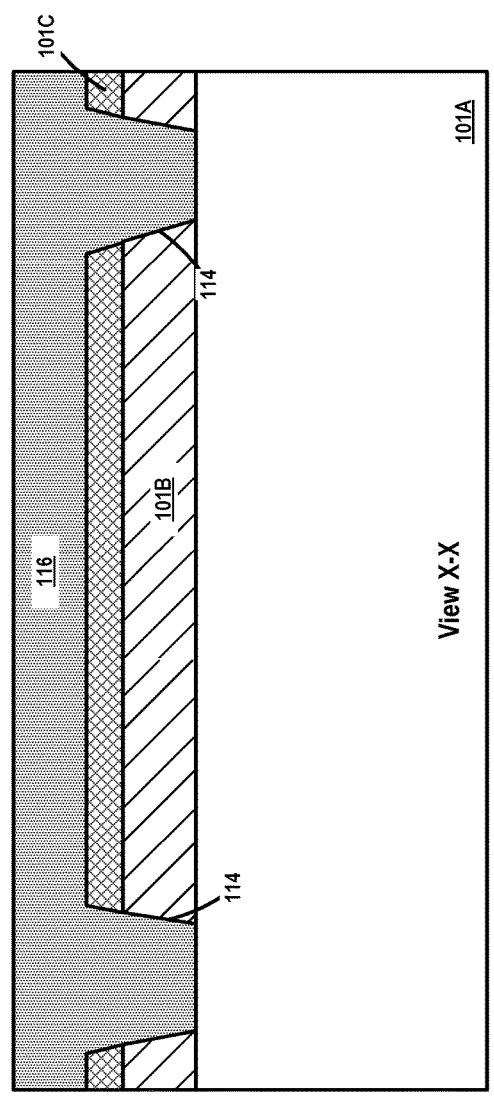
Figure 7:
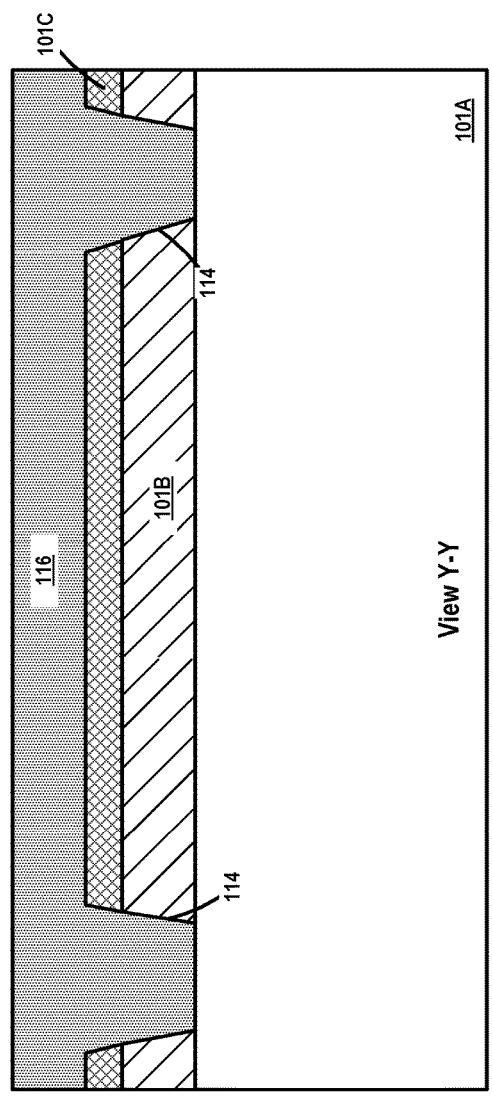
Figure 8:
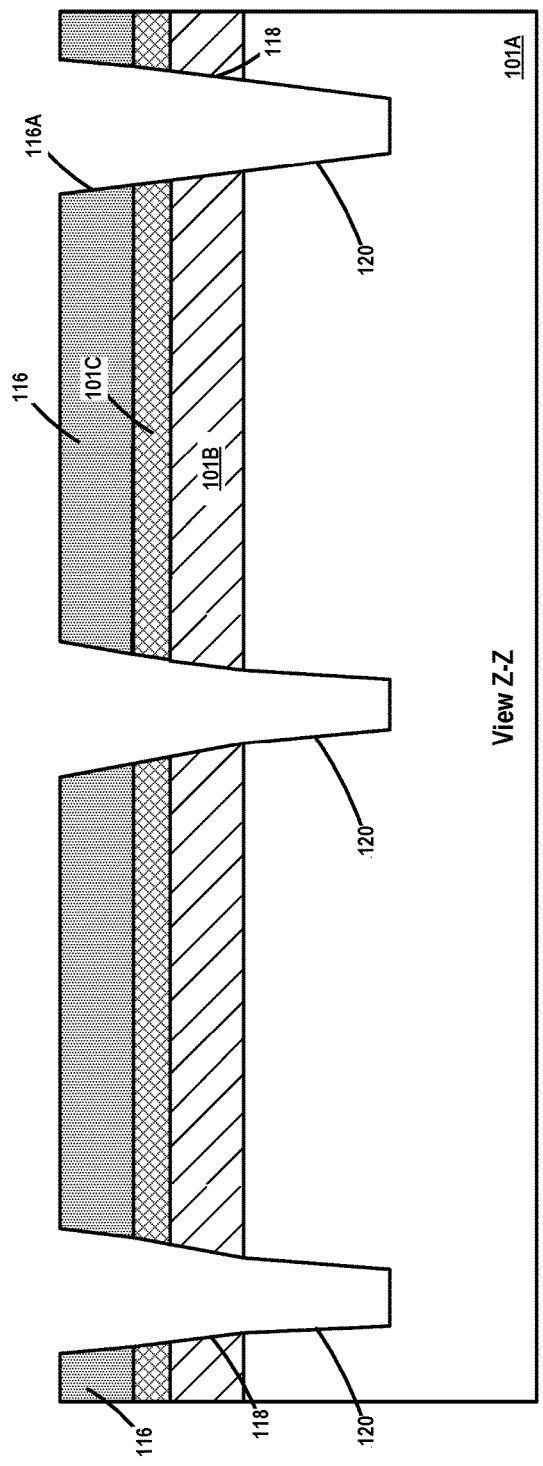

FIG. 6 (view X-X), FIG. 7 (view Y-Y) and FIG. 8 (view Z-Z) depict the IC product 100 after several process operations were performed. First, the patterned etch mask 112 was removed. Thereafter, another patterned etch mask 116, e.g., a patterned layer of photoresist or a patterned hard mask, was formed above the active layer 101C. The patterned etch mask 116 comprises a plurality of openings 116A (see FIG. 8) that correspond to the locations where the relatively deeper isolation structures 104 will be formed. Thereafter, one or more common etching processes were performed through the patterned etch mask 116 to remove exposed portions of the active layer 101C, and, thereafter, exposed portions of the buried insulation layer 101B and portions of the bulk semiconductor layer 101A. These process operations result in the formation of relatively deeper trenches 120 (see FIG. 8) that extend through the active layer 101C, through the buried insulation layer 101B and into the bulk semiconductor layer 101A. The depth to which the trenches 120 extend into the bulk semiconductor layer 101A may vary depending upon the particular application, e.g., 100-

400 nm. Note that, during this process operation, the patterned etch mask 116 fills the previously formed shallow trenches 114. Also note that, in the illustrative process flow depicted herein, the shallow trenches 114 were formed prior to the formation of the deeper trenches 120. However, if desired, the deeper trenches 120 could have been formed prior to the formation of the shallow trenches 114.

Figure 9:
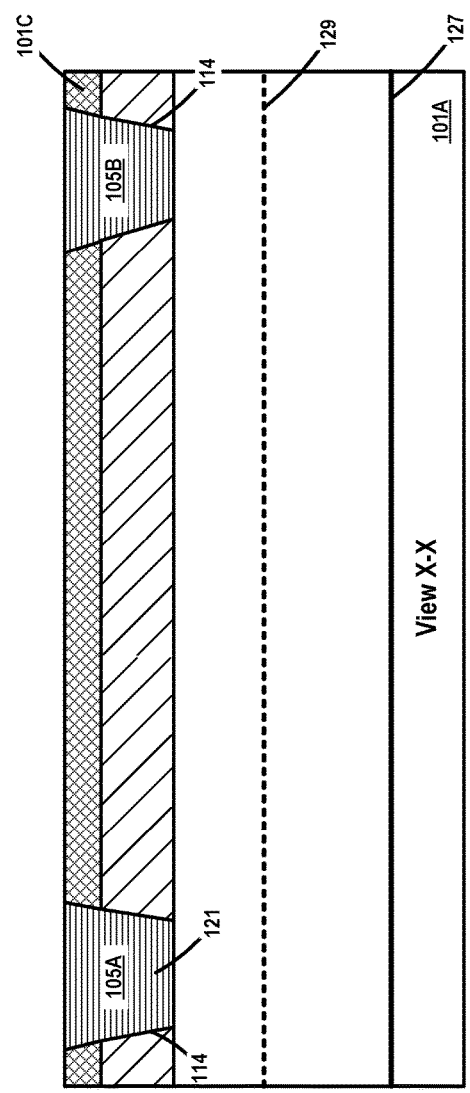
Figure 10:
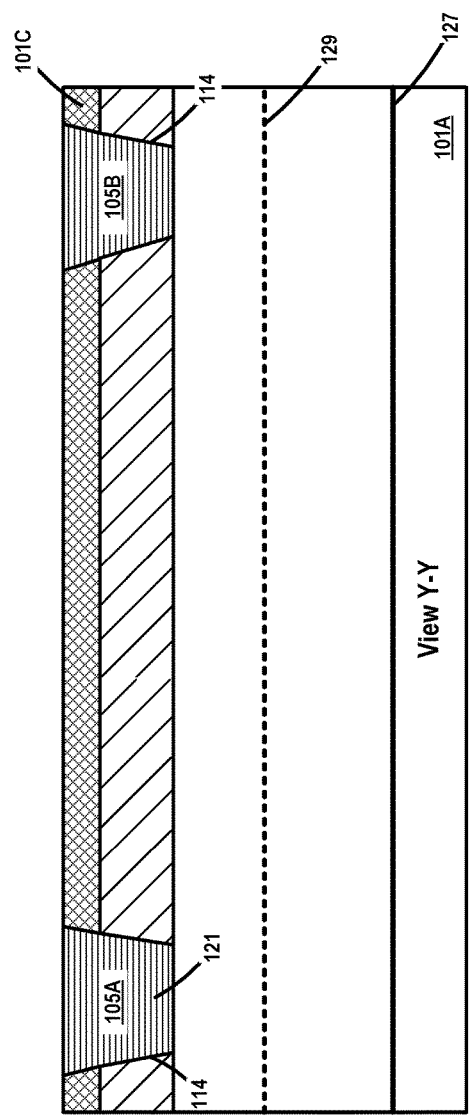
Figure 11:
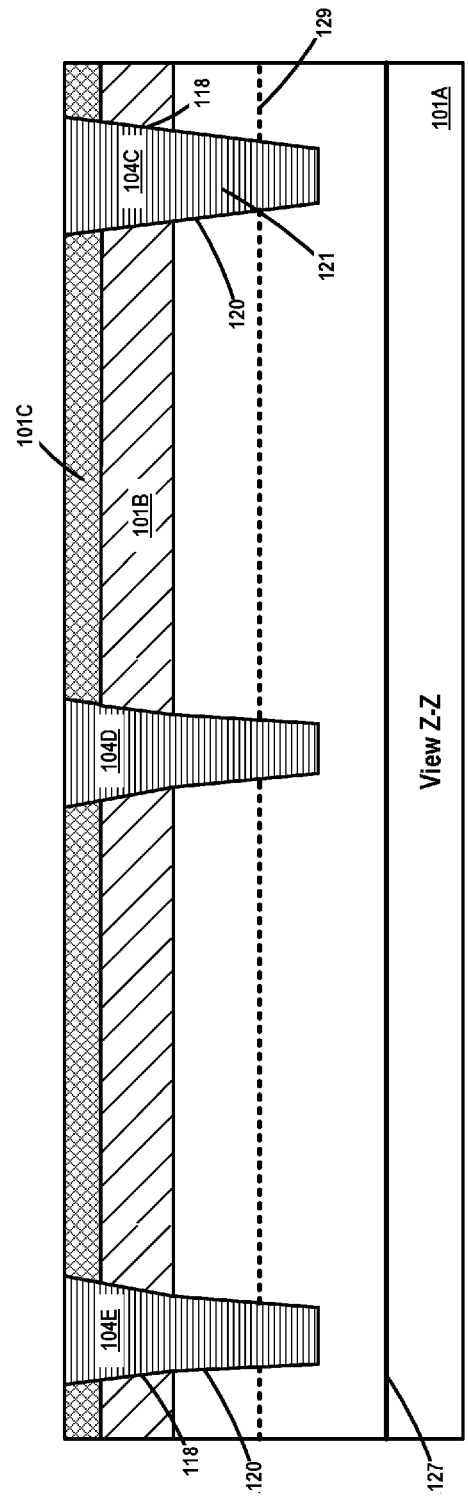

FIG. 9 (view X-X), FIG. 10 (view Y-Y) and FIG. 11 (view Z-Z) depict the IC product 100 after several process operations were performed. First, the patterned etch mask 116 was removed. Next, insulating material 121, such as silicon dioxide, was deposited so as to over-fill the trenches 114 and 120 such that the insulating material 121 was positioned above the upper surface of the active layer 101C. Thereafter, a CMP process was performed to planarize the upper surface of the deposited layer of insulating material 121 with the upper surface of the active layer 101C. These process operations result in the formation of the relatively deeper isolation structures 104 in the trenches 120 and the relatively shallower isolation structures 105 in the trenches 114. The formation of the isolation structures 104, 105 effectively define or form fully isolated sections of the active layer 101C where transistor devices 152 and floating gate capacitors 150 may be formed.

With continuing reference to FIGS. 9-11, the next major process operations involve the formation of various doped wells in the bulk semiconductor layer 101A. First, in one illustrative embodiment, a relatively deep N-doped well 127 was formed in the bulk substrate 101A followed by the formation of a relatively shallower P-doped well 129 in the bulk semiconductor layer 101A. The wells 127, 129 may be formed by performing well-known ion implantation processes through a patterned implant mask (not shown). With reference to FIG. 11, note that the deeper isolation structures 104 extend through the relatively shallower P-doped well 129, but, in one embodiment, the isolation structures 104 do not extend beyond the depth of the deep well 127. The concentration of dopants in each of the well regions 127, 129 may vary depending upon the particular application. In the depicted example, the transistors 152 are N-type devices. As is known to those skilled in the art, in the case of SOI transistors, the presence of the buried insulating layer 101B allows the polarity of the dopants of the well regions 127, 129 to be either N-type or P-type. In the depicted example, the P-doped well 129 was positioned in the relatively deep N-doped well 127 so that the typically P-type substrate material 101A can be isolated from the P-doped well 129 by applying a positive bias on the deep N-doped well 127.

Figure 12:
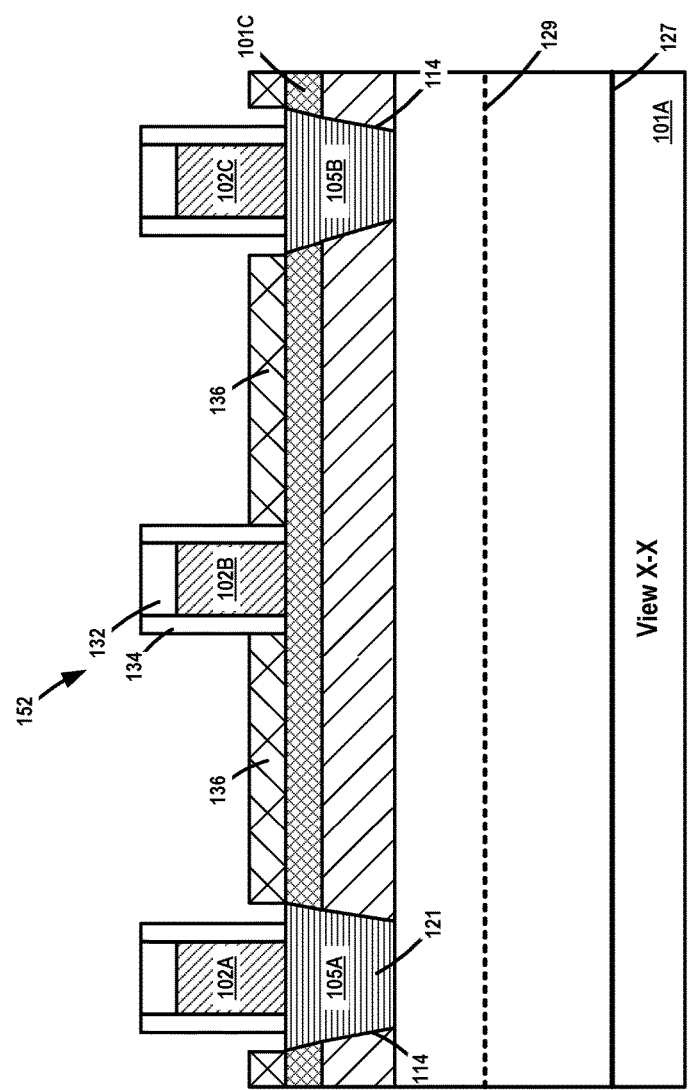
Figure 13:
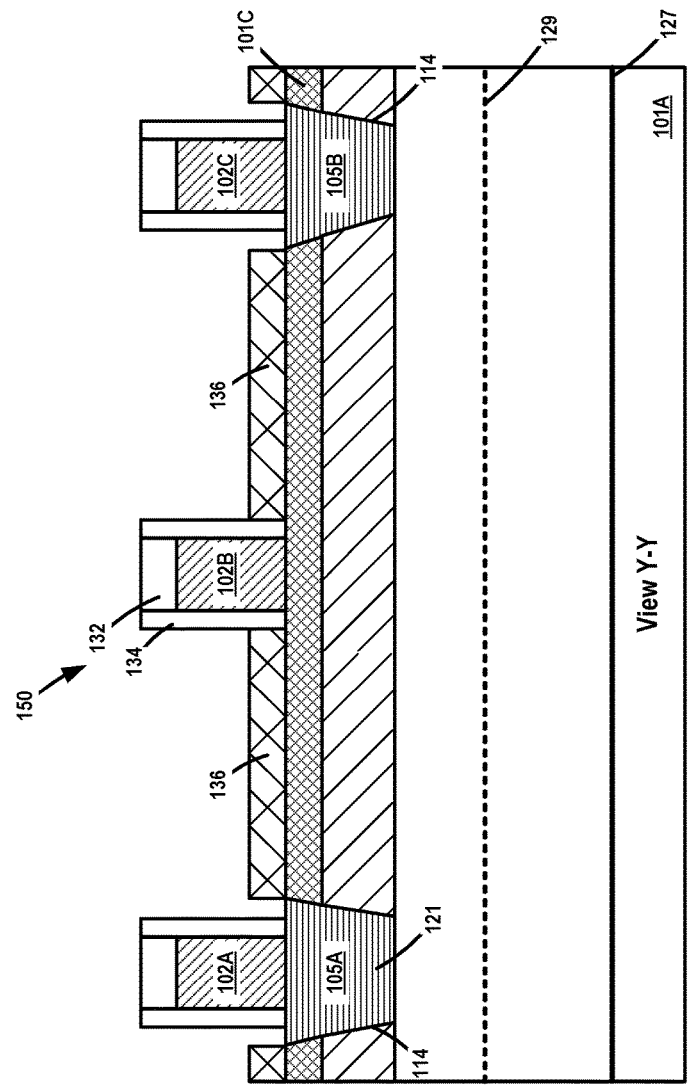
Figure 14:
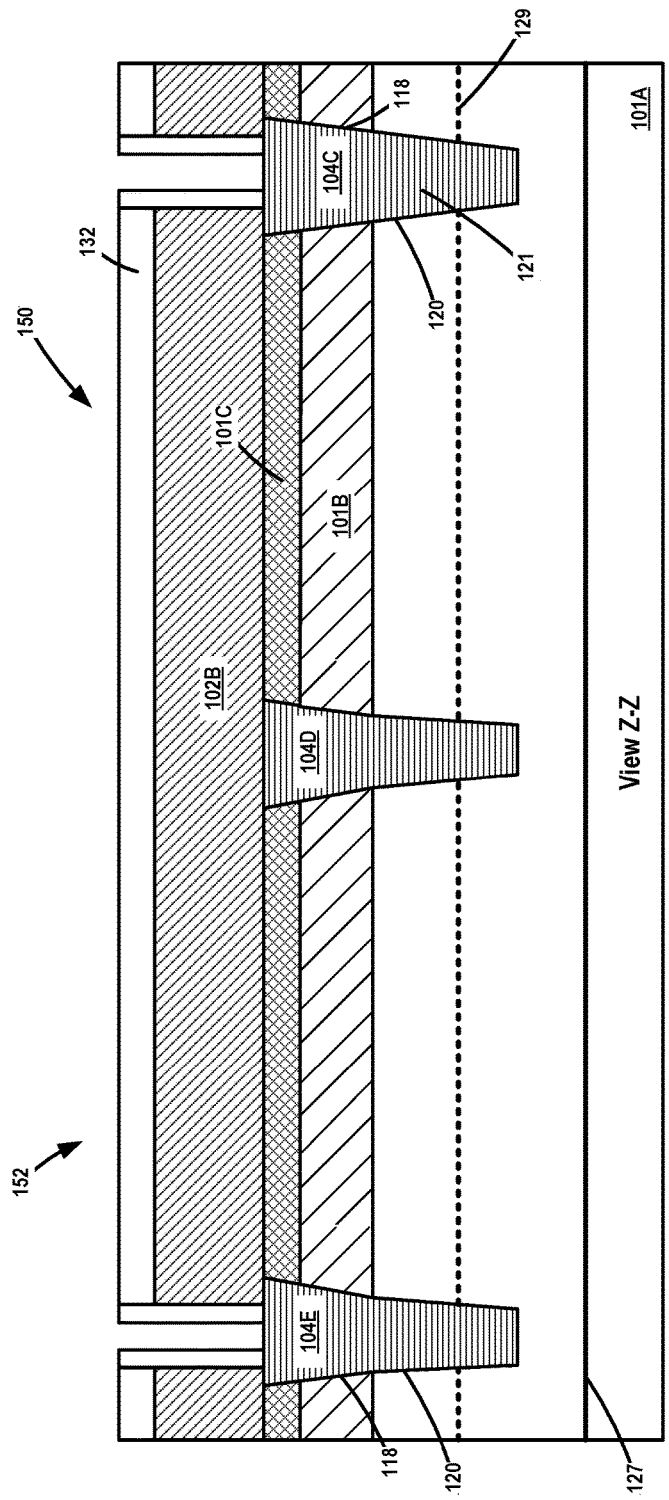

FIG. 12 (view X-X), FIG. 13 (view Y-Y) and FIG. 14 (view Z-Z) depict the IC product 100 after several process operations were performed. First, the gate structures 102, each with a gate cap 132 formed thereabove, were formed above the substrate 101. Next, simplistically depicted sidewall spacers 134 were formed adjacent the gate structures 102 by performing traditional spacer manufacturing techniques, i.e., depositing a conformal layer of spacer material and performing an anisotropic etching process. Next, epi semiconductor material 136 was formed on the exposed portions of the active layer 101C between the spacers 134, i.e., in the source/drain regions of the transistor devices 152 and on the active layer of the floating gate capacitor 150, by performing an epitaxial growth process. The epi material 136 may be formed to any desired thickness. However, it should be understood that the epi material 132 need not be formed in all applications. If desired, at this point a metal silicide layer (not shown) may be formed on the epi semiconductor material 136 and on the gates 102 after removal of desired portions of the gate caps 132. Other layers of material, such as contact etch stop layers and the like, are not depicted in the drawings. Additionally, the doped source/drain regions for the transistors 152 are not depicted in the drawing, but they would typically be formed by in situ doping during the epi growth process or by performing one or more ion implantation processes after the formation of the gate structures 102 and after the formation of the epi semiconductor material 136. As best seen in FIG. 14, the floating gate 102B extends across the isolation structure 104D and is positioned above both of the floating gate capacitor 150 and the transistor 152. As will be appreciated by those skilled in the art after a complete reading of the present application, the gate structures 102 depicted herein are intended to be representative of any type of gate structure that may be formed using any manufacturing technique (e.g., gate-first or replacement gate) and they may be comprised of any of a variety of different materials. Each of the conductive gate structures 102 typically comprises a gate insulation layer (not separately shown) and a conductive gate electrode (not separately shown). The gate insulation layer may be comprised of a material such as silicon dioxide or a high-k (k value greater than 10) insulating material. The gate electrode may be comprised of one or more conductive materials, e.g., a metal, a metal alloy, titanium nitride, tantalum nitride, tungsten, aluminum, polysilicon, etc.

Figure 15:
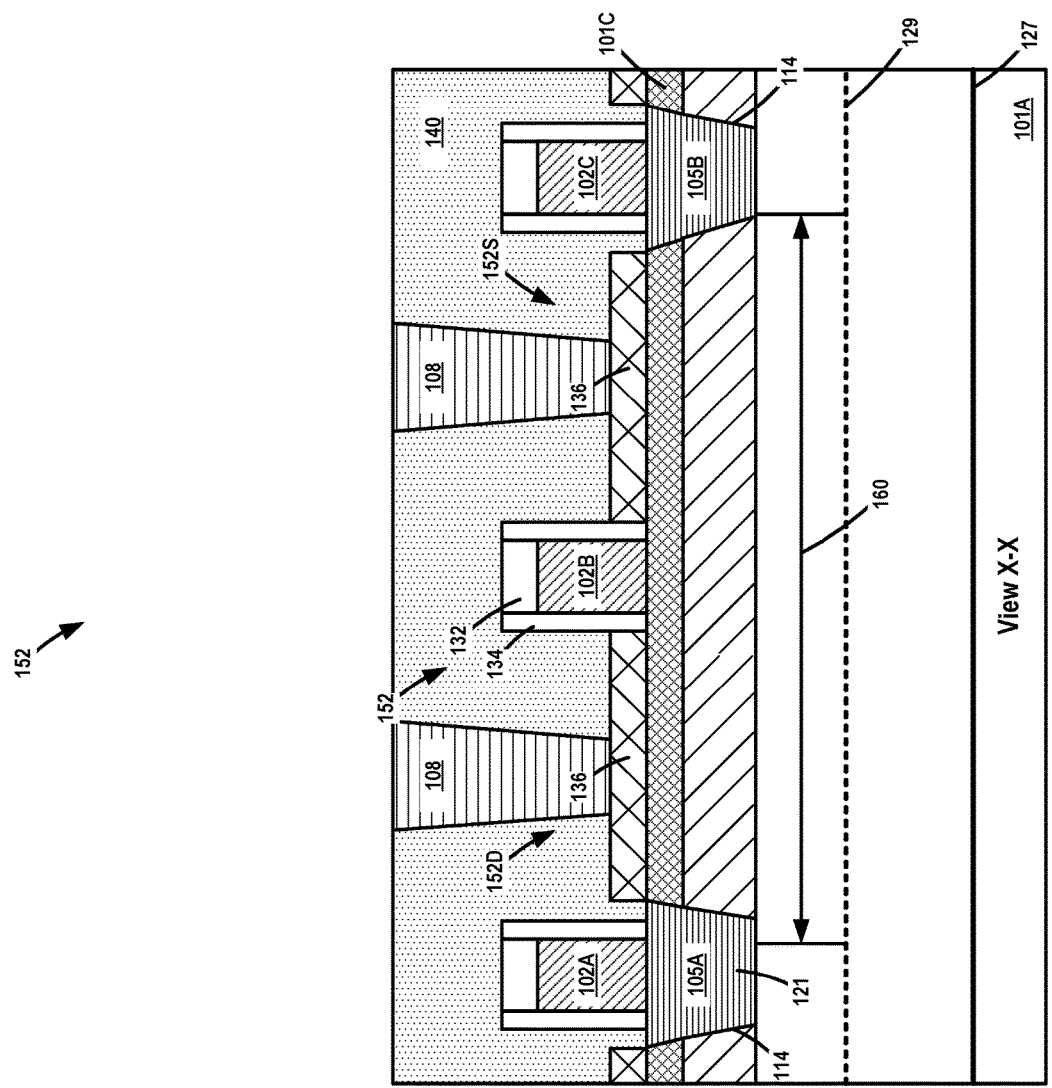
Figure 16:
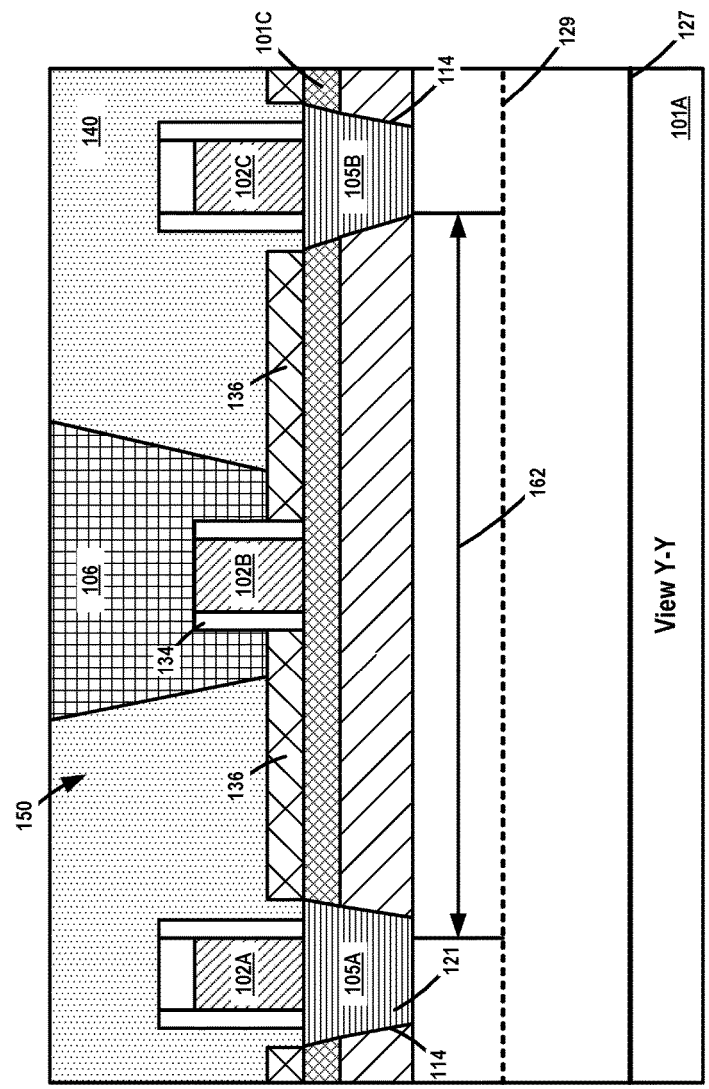
Figure 17:
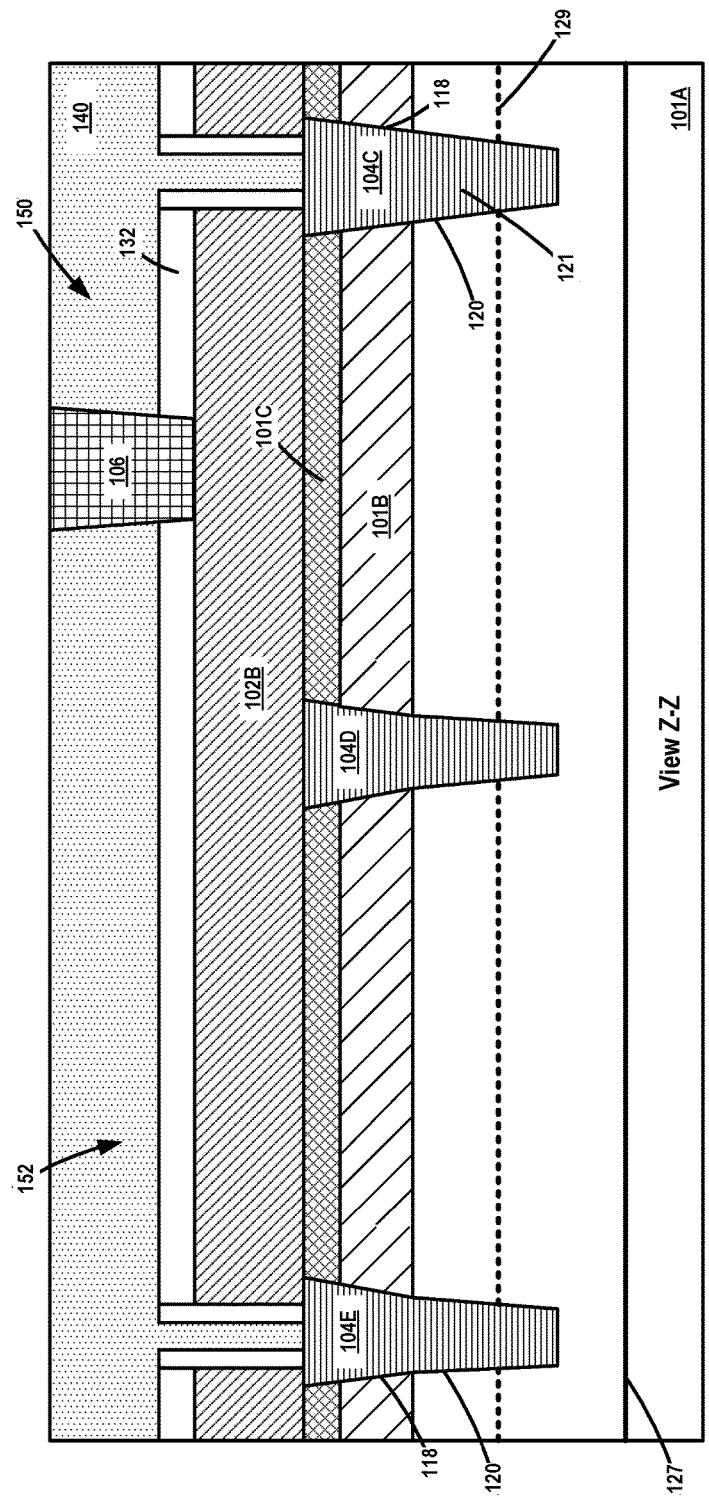

FIG. 15 (view X-X), FIG. 16 (view Y-Y) and FIG. 17 (view Z-Z) depict the IC product 100 after several process operations were performed. First, additional insulating material 140 (e.g., silicon dioxide, a low-k material, etc.) was formed above the substrate 101. The insulating material 140 is depicted as being a single layer of material but it should be understood to be representative of one or more layers of insulating material that may be formed above the substrate. Thereafter, various process operations were performed to form the illustrative source/drain contact structures 108 for the source 152S and the drain 152D of the transistor 152 (see FIG. 15) and the enlarged gate contact structure 106 for the floating gate capacitor 150 (see FIGS. 16 and 17). With reference to FIG. 16, note that the enlarged gate contact structure 106 is formed such that it is conductively coupled to the gate structure 102B as well as the portion of the active layer 101C that is part of the floating gate capacitor 150. More specifically, in the particular example depicted herein, the enlarged gate contact structure 106 conductively contacts and physically engages the epi semiconductor material 136 formed on the floating gate capacitor 150. As a result of this unique configuration, the combination of the gate structure 102B above the floating gate capacitor 150, the isolated portion of the active layer 101C on which the floating gate capacitor 150 is formed and, when present, the epi semiconductor material 136 formed for the floating gate capacitor 150 effectively functions as an enlarged gate electrode. This enlarged gate electrode has a foot-print that corresponds approximately to the size of the isolated portion of the active layer 101C upon which the floating gate capacitor 150 is formed. Additionally, due to the process operations above, a portion of the bulk semiconductor layer 101A within the well region 129 constitutes a back gate electrode 160 (see FIG. 15) for the transistor 152. Another portion of the bulk semiconductor layer 101A within the well region 129 constitutes a control gate electrode 162 (see FIG. 16) for the floating gate capacitor 150.

The contact structures 108, 106 disclosed herein may have a variety of configurations and may be comprised of one or more conductive materials. In some applications, the contact structures 108, 106 may take the form of "trench silicide" (TS) structures. The contact structures 108 may take the form of discrete contact elements, i.e., one or more individual contact plugs having a generally square-like shape or round shape when viewed from above. Irrespective of their form, the contact structures 108, 106 may be contacted by various contact structures (conductive lines and/or vias) formed in one or more metallization layers formed above the transistor devices (e.g., M0; M1/V0, etc.). The contact structures 108, 106 may be formed of any desired conductive materials and they may be formed using any desired technique.

Figure 18:
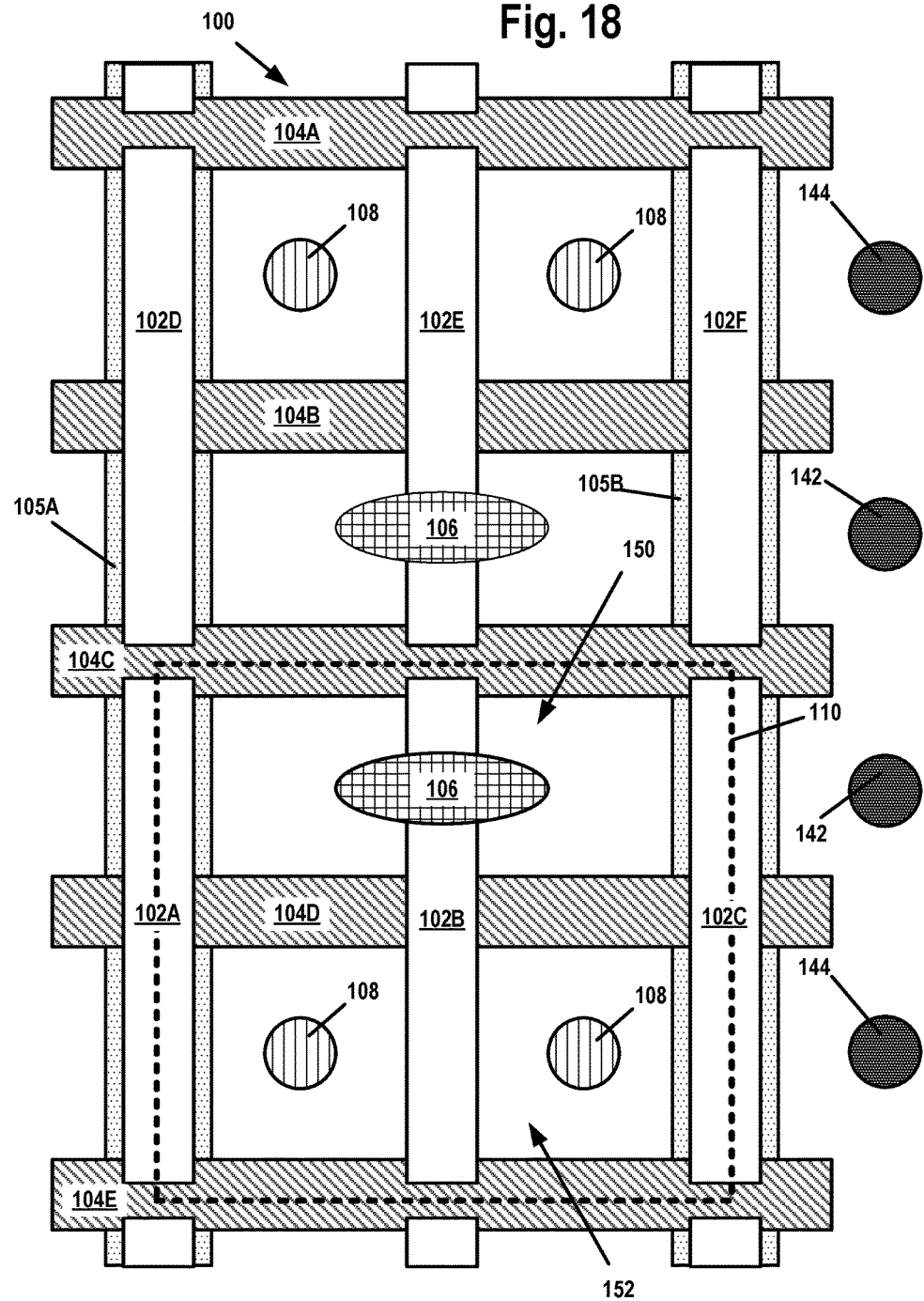
Figure 19:
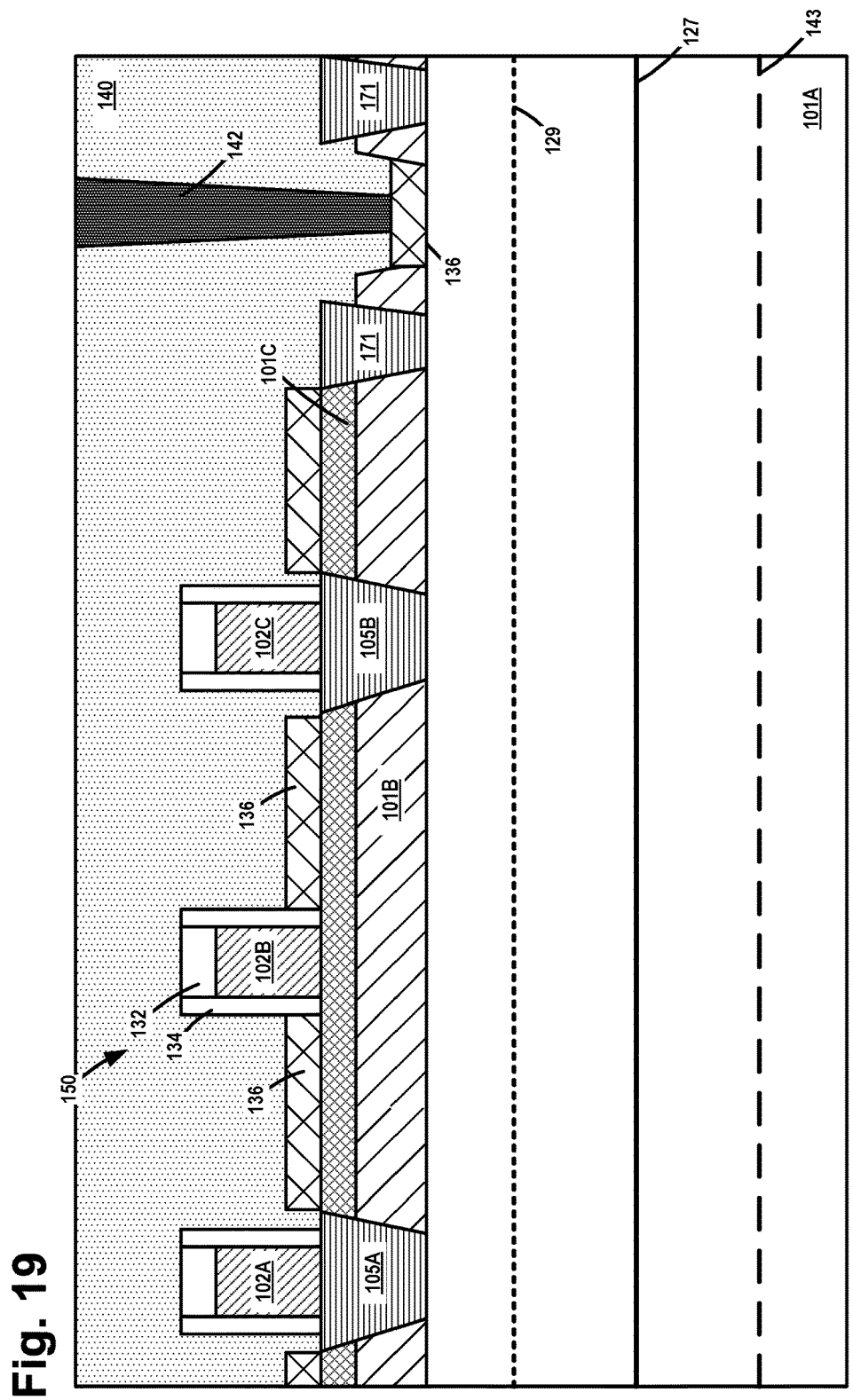

As will be appreciated by those skilled in the art, in one embodiment, millions of the floating gate capacitors 150 and the transistors 152 may be formed in an array on a real world product 100. FIGS. 18 (plan view), 19 (view X-X) and 20 (cross-sectional view of the floating gate capacitor 150) depict the product 100 after additional doped wells and contact structures 142 and 144 were formed on the product 100 so as to permit electrical access to, respectively, the control gates 162 of the floating gate capacitors 150 and the back gates 160 of the transistors 152. More specifically, with reference to FIG. 19, in one illustrative embodiment, a deep N-well 143 was selectively formed under only the floating gate capacitors 150 so as to provide a means to apply a voltage to the control gate 162 of all of the floating gate capacitors 150 arranged in a particular row at the same time. An isolation structure 171 was also formed between the contact structures 142 and 144 and the active memory cell 110. The isolation structure 171 completely surrounds the well contact area. The deep N-well 143 may be formed to a depth that is greater than the depth of the deep trench structures 104. The deep N-well 143 may be formed by performing an implant process through a patterned implant mask (not shown) that exposes the floating gate capacitors 150 while masking the transistors 152. Also depicted in FIG. 19 is an illustrative portion of the epi semiconductor material 136 that was formed on the bulk semiconductor layer 101A at the same time as the other epi semiconductor material was formed on the product.

Figure 20:
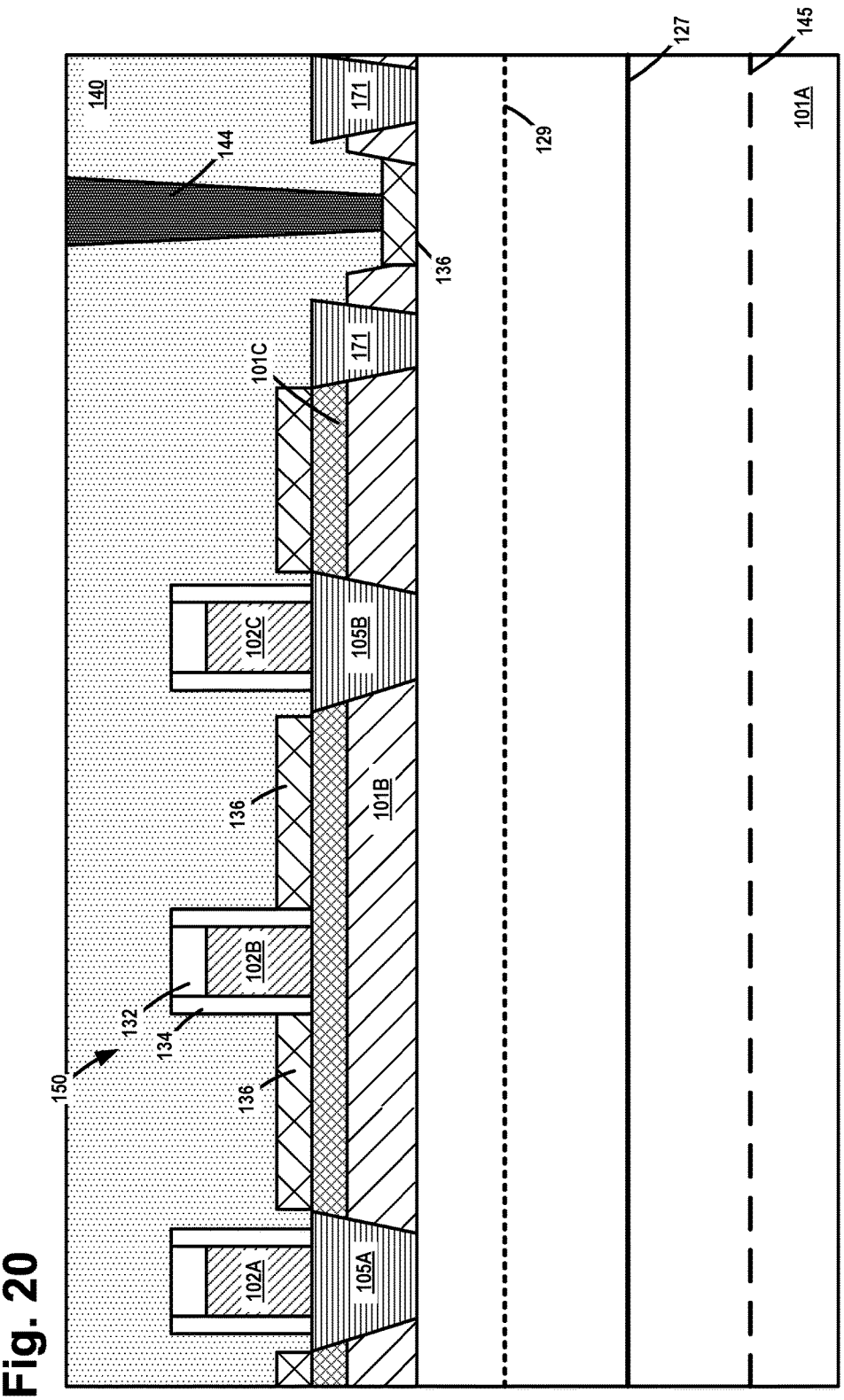

Similarly, and with reference to FIG. 20, another deep N-well 145 was selectively formed under only the transistors 152 so as to provide a means to apply a voltage to the back gate 160 of all of the transistors 152 arranged in a particular row at the same time. The deep N-well 145 is separate from the deep N-well 143. The deep N-well 145 may be formed to a depth that is greater than the depth of the deep trench structures 104. The deep N-well 145 may be formed by performing an implant process through a patterned implant mask (not shown) that exposes the transistors 152 while masking the floating gate capacitors 150. Also depicted in FIG. 20 is an illustrative portion of the epi semiconductor material 136 that was formed on the bulk semiconductor layer 101A at the same time as the other epi semiconductor material was formed on the product.

As will be appreciated by those skilled in the art after a complete reading of the present application, the floating gate capacitors 150 and the transistors 152 may be arranged in a variety of different configurations on an integrated circuit product. FIG. 21 is an electrical schematic of one illustrative embodiment of an array that includes a plurality of the above-described floating gate capacitors 150 and the transistors 152. The illustrative back gate structure 160 for the transistors 152 is not depicted in this schematic. Also depicted are illustrative word lines (WL) 170, bit lines (BL) 172 and source lines (SL) 174. The word lines 170 (i.e., formed by the P-wells 129) are formed in the bulk semiconductor layer 101A and connect the control gates 162 that are formed in the bulk semiconductor layer 101A. The bit lines 172 and the source lines 174 are formed in the metallization layers of the product 100. The bit lines 172 and the source lines 174 are conductively coupled to, respectively, the drain regions 152D and source regions 152S of the transistors 152. In operation, a relatively large voltage is applied to the control gate 162 so as to induce voltage on the floating gate 102B. Since the floating gate 102B is also shared by the N-type transistor 152, the presence of a positive voltage (or logically high voltage) on the floating gate 102B also turns the transistor 152 "ON" thereby allowing charge to flow from the source drain/regions and tunnel across the gate insulation layer of the transistor 152 onto the floating gate 102B. The capacitance ratio of the capacitor 150 to the total capacitance of the floating gate 102B is chosen to ensure that the electric field is significantly larger across the gate insulation layer of the transistor 152 than it is across the floating gate capacitor 150. As such, tunneling occurs only across the gate insulation layer of the transistor 152 and not across the floating gate capacitor 150. In an erase operation, a relatively large negative voltage is applied to the control gate 162 and charge tunnels from the floating gate 102B to the source drain regions of transistor 152. The presence or absence of charge on the floating gate 102B can be detected by determining if the transistor 152 is on or off based upon the presence or absence of current flow through the transistor 152. If employed, the back gate 160 of the transistor 152 may be used to control the threshold voltage of the transistor 152. Controlling the threshold voltage of the transistor 152 may be useful for a variety of reasons, such as, for example, eliminating the need for a threshold voltage implant, suppressing leakage from cells in an unselected wordline during a read operation, or allowing flexibility of the wordline voltage during read, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:
1. A device, comprising:
  a semiconductor-on-insulator substrate comprising a bulk semiconductor layer, an active semiconductor layer and a buried insulating layer positioned between said bulk semiconductor layer and said active semiconductor layer;
  an isolation trench that extends into said bulk semiconductor layer;
  a floating gate capacitor located in and above a first region of said substrate located on a first side of said isolation trench, said floating gate capacitor comprising a control gate formed in said bulk semiconductor layer in said first region;
a transistor device located in and above a second region of said substrate located on a second side of said isolation trench, said second side being opposite said first side; and
a gate structure that extends across said isolation trench and above said first and second regions, a first portion of said gate structure being positioned above said first region and said control gate, said first portion constituting a floating gate for said floating gate capacitor, a second portion of said gate structure being positioned above said second region, said second portion constituting a transistor gate structure for said transistor device.

2. The device of claim 1, wherein said transistor device further comprises a back gate electrode formed in said bulk semiconductor layer in said second region, wherein said second portion of said gate structure is positioned above said back gate electrode.

3. The device of claim 2, wherein said isolation trench is positioned between and electrically isolates said control gate from said back gate.

4. The device of claim 1, wherein said control gate abuts said isolation trench.

5. The device of claim 1, wherein said isolation trench electrically isolates said floating gate capacitor from said transistor device.

6. The device of claim 1, wherein said first portion of said gate structure is positioned above a first portion of said active semiconductor layer and said transistor is formed in and above a second portion of said active semiconductor layer that is electrically isolated from said first portion of said active semiconductor layer by at least said isolation structure.

7. The device of claim 1, wherein said first portion of said gate structure is positioned above a first portion of said active semiconductor layer and wherein said device further comprises a conductive gate contact structure that is conductively coupled to said first portion of said gate structure and said first portion of said active semiconductor layer.

8. The device of claim 7, wherein said conductive gate contact structure physically contacts an epi semiconductor material positioned on said first portion of said active semiconductor layer.

9. The device of claim 7, further comprising a sidewall spacer positioned adjacent sidewalls of said first portion of said gate structure, wherein a portion of said sidewall spacer is positioned between a portion of said first portion of said gate structure and said conductive gate contact structure.

10. The device of claim 1 wherein said transistor is a planar N-type transistor.

11. The device of claim 1, further comprising:
an N-well positioned in said bulk semiconductor layer under said control gate; and
a contact structure that is conductively coupled to said N-well, wherein a voltage may be applied to said control gate via said contact structure and said N-well.

12. A device, comprising:
a semiconductor-on-insulator substrate comprising a bulk semiconductor layer, an active semiconductor layer and a buried insulating layer positioned between said bulk semiconductor layer and said active layer;
an isolation trench that extends into said bulk semiconductor layer;
a floating gate capacitor located in and above a first region of said substrate located on a first side of said isolation trench, said first region comprising a first isolated portion of said active semiconductor layer, said floating gate capacitor comprising a control gate formed in said bulk semiconductor layer in said first region;
a transistor device located in and above a second region of said substrate located on a second side of said isolation trench, said second side being opposite said first side, said second region comprising a second isolated portion of said active semiconductor layer that is electrically isolated from said first isolated portion of said active semiconductor layer; and
a gate structure that extends across said isolation trench and above said first and second isolated portions of said active semiconductor layer, a first portion of said gate structure being positioned above said first isolated portion of said active semiconductor layer and said control gate, said first portion of said gate structure constituting a floating gate for said floating gate capacitor, a second portion of said gate structure being positioned above said second isolated portion of said active semiconductor layer, said second portion of said gate structure constituting a transistor gate structure for said transistor device.

13. The device of claim 12, wherein said transistor device further comprises a back gate electrode formed in said bulk semiconductor layer in said second region, wherein said second portion of said gate structure is positioned above said back gate electrode.

14. The device of claim 13, wherein said control gate abuts said isolation trench.

15. The device of claim 14, wherein said isolation trench is positioned between and electrically isolates said control gate from said back gate.

16. The device of claim 13, wherein said isolation trench electrically isolates said floating gate capacitor from said transistor.

17. The device of claim 13, wherein said conductive gate contact structure physically contacts an epi semiconductor material positioned on said first isolated portion of said active semiconductor layer.

18. The device of claim 13, further comprising a sidewall spacer positioned adjacent sidewalls of said first portion of said gate structure, wherein a portion of said sidewall spacer is positioned between a portion of said first portion of said gate structure and said conductive gate contact structure.

19. The device of claim 13, further comprising:
an N-well positioned in said bulk semiconductor layer under said control gate; and
a contact structure that is conductively coupled to said N-well, wherein a voltage may be applied to said control gate via said contact structure and said N-well.

* * * * *